United States Patent
Hsieh et al.

(10) Patent No.: US 7,101,933 B2
(45) Date of Patent: Sep. 5, 2006

(54) PROCESS FOR PRODUCING HIGH SPEED TRANSMITTING DIELECTRIC MATERIAL

(75) Inventors: Chen-Yu Hsieh, Taoyuan Hsien (TW); Ming-Cheng Hsiao, Taoyuan Hsien (TW); Tai-Wen Chien, Taoyuan Hsien (TW)

(73) Assignee: Uniplus Electronics Co., Ltd., Taoyuan Hsien (TW)

( * ) Notice: Subject to any disclaimer, the term of this patent is extended or adjusted under 35 U.S.C. 154(b) by 278 days.

(21) Appl. No.: 10/731,502

(22) Filed: Dec. 10, 2003

(65) Prior Publication Data
US 2005/0131166 A1 Jun. 16, 2005

(51) Int. Cl.
*C08L 63/00* (2006.01)
*C08L 71/12* (2006.01)

(52) U.S. Cl. ...................... 525/109; 525/396
(58) Field of Classification Search .................. 525/396
See application file for complete search history.

(56) References Cited

U.S. PATENT DOCUMENTS 5,043,367 A * 8/1991 Hallgren et al. ............ 523/429
5,262,491 A * 11/1993 Jain et al. ................... 525/396
5,821,305 A * 10/1998 Schutyser et al. .......... 525/112
5,834,565 A * 11/1998 Tracy et al. ................ 525/391
6,387,990 B1 * 5/2002 Yeager ........................ 523/434
7,022,777 B1 * 4/2006 Davis et al. ................ 525/396

FOREIGN PATENT DOCUMENTS

JP    5-25451 A  *  2/1993
JP    9-202850 A *  8/1997

* cited by examiner

*Primary Examiner*—Robert Sellers
(74) *Attorney, Agent, or Firm*—Troxell Law Office, PLLC

(57) ABSTRACT

A process for producing high speed transmitting dielectric materials comprises essentially mixing and reacting a proportion of polyphenylene ether (PPE) with a proportion of an epoxy resin of the type of low bromine content in a non-polar solvent in the presence of a catalyst in a reactor at a temperature of 90° C. to 220° C., characterized in that, in the course of the reaction, PPE needs not to be cleaved into small molecules and in stead, can mix and react directly with the epoxy resin to thereby produce a high speed transmitting dielectric material. The process of the invention can reduce greatly the synthetic reaction time, and is applicable in the production of the material useful in printed circuit board for wireless communication, base station and the like.

8 Claims, 6 Drawing Sheets

PROCESS FOR PRODUCING HIGH SPEED TRANSMITTING DIELECTRIC MATERIAL

BACKGROUND OF THE INVENTION

1. Field of the Invention

The invention relates to a process for producing high speed transmitting dielectric material, and in particular, to a process for producing high speed transmitting dielectric material by reacting directly polyphenylene ether (PPE) with an epoxy, characterized in that said PPE needs not to be cleaved into small molecules, and can therefore shorten greatly the reaction time. The process of the invention is applicable in the manufacture of printed circuit board material used in wireless communication, base station and the like.

2. Description of the Prior Art

Conventional processes for producing high speed transmitting dielectric material comprised of, as shown in FIGS. 7 and 8, cleaving firstly a polyphenylene ether (PPE) (A) of high molecular weight into PPE (B) of small molecular weight through chain cleavage with a peroxides, and then, after mixing with an epoxy resin (C) (a solvent-type epoxy of low bromine content), carrying out a reaction in the presence of a catalyst and a hardener to produce dielectric materials such as a prepreg, copper-clad laminate (CCL) and the like.

However, the above-described conventional processes had the following disadvantages:

1. Since current high frequency substrates or wireless communication substrates must have a certain specification, for example, when the specification of a product regulates the substrate at a thickness of below 1.6 mm, a dielectric constant of less than 4.0 and a loss factor of below 0.01, the original characteristics of high frequency substrates or wireless communication substrates can be retained subsequently. Under this circumstance, the high speed transmitting dielectric material produced by conventional processes based on the cleavage of PPE of high molecular weight may not meet requirements of current application.

2. PPE of this specification is used only in some particular manufacturers, and has high cost. In case to be mixed with other materials, PPE of high molecular weight has to be mixed with an epoxy resin only after being cleaved into PPE of small molecular weight. Moreover, since a number of factors such as, for example, the amount of the catalyst used, the reaction temperature, the desired small molecular weight and the like must be considered in the cleavage process, these processes were considerably time-consuming.

3. In conventional process, PPE of high molecular weight must be subjected to chain cleavage, reaction and formulating in the presence of a peroxide as the catalyst under high temperature, these all increase risks of those process.

In view of the forgoing, for improving the above-mentioned disadvantages such that PPE of high molecular weight can be mixed directly with an epoxy without necessity to subjected to chain cleavage and as a result, time required for chain cleavage can be eliminated as well as risks and problems occurred during the chain cleavage, the inventor had studied and carried out experiments extensively for many years based on his experience, and finally, developed the present invention.

SUMMARY OF THE INVENTION

The principal object of the invention is to provide a process for producing high speed transmitting dielectric material, characterized in that, unlike conventional processes, PPE can be mixed directly with an epoxy without necessity of cleaving PPE into small molecules, and such that the reaction time can be greatly reduced.

In a preferred embodiment, the process for producing high speed transmitting dielectric material comprises steps of:

a: mixing a proportion of 5%–95% by weight of PPE with a corresponding proportion of 95%–5% by weight of an epoxy resin of the type of low bromine content;

b: reacting the mixture from step a in a non-polar solvent in the presence of 0.2%–1% by weight of a catalyst in a reactor of a temperature of 90° C.–220° C. the proportions based on the combined weight of the components;

c: as the temperature in the reactor lowered to 70° C., adding a hardener in the reactor and allowing it to be dissolved therein; and d: formulating PPE and said epoxy resin into a varnish before phase separating occurring;

and thereby, dielectric materials such as prepreg or copper clad laminate can be prepared.

The drawings disclose an illustrative embodiment of the invention which serve to exemplify the various advantages and objects hereof, and are as follows:

SYMBOLS IN THE DRAWINGS

A: PPE of high molecular weight
B: PPE of small molecular weight
C: Epoxy resin
1: PPE of high molecular weight
2: Epoxy resin

DETAILED DESCRIPTION OF THE PREFERRED MBODIMENT

In order to more deeply understand, the invention will be described in more detail by way of a non-limiting example as follows.

Figure 1:
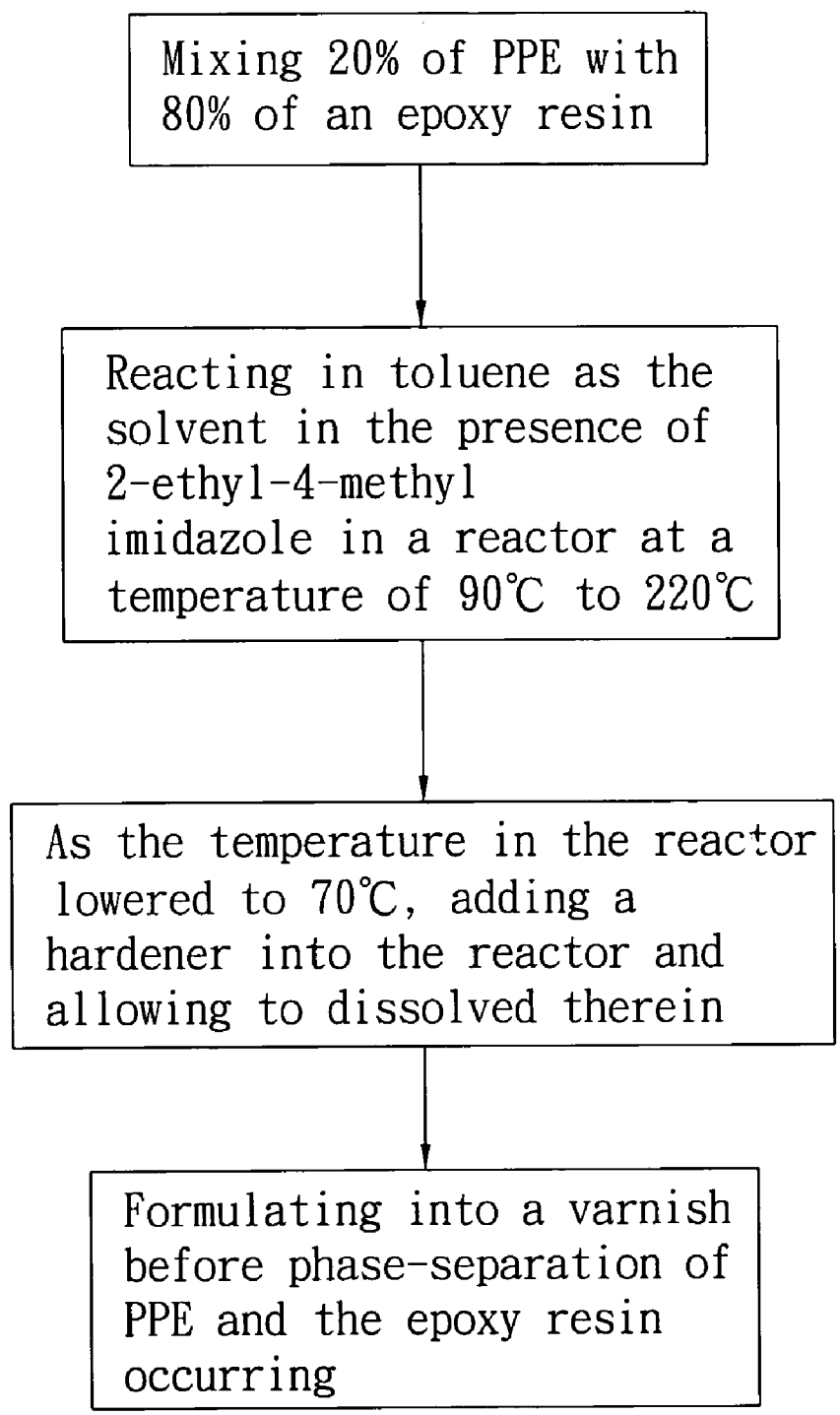
FIG. 1 is the flow chart illustrating an embodiment of the process according to the invention.

Referring to FIG. 1, in one embodiment of the process for producing high speed transmitting dielectric material comprises:

step a: mixing a proportion of 20% by weight of PPE with a corresponding proportion of 80% by weight of an epoxy resin of the type of low bromine content;

step b: reacting the mixture from step a in toluene as a non-polar solvent in the presence of 2-ethyl-4-methyl imidazole as a catalyst in a reactor of a temperature of 90° C.–220° C.;

step c: as the temperature in the reactor lowered to 70° C., adding a hardener in the reactor and allowing it to be dissolved therein; and step d: formulating PPE and said epoxy resin into a varnish before phase separating occurring;

wherein, in order to avoid vaporization of the non-polar solvent, a cooling device by way of circulation can be provided further in the reactor in the previous stated step b.

Figure 2:
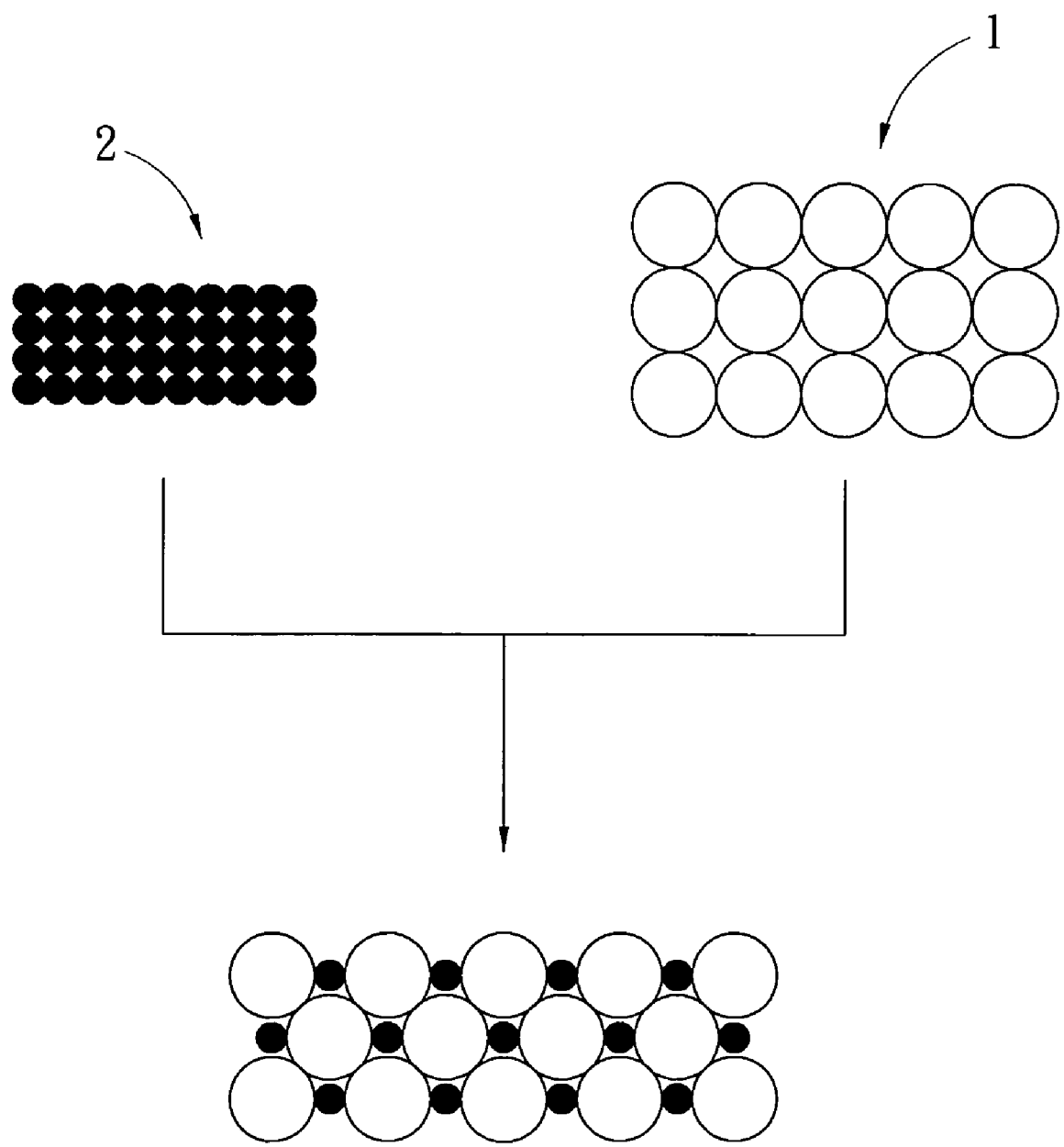
FIG. 2 is a schematic view illustrating the step of mixing PPE of high molecular weight and an epoxy resin in the process according to the invention.

Thereafter, dielectric materials such as prepreg or copper clad laminate can be prepared through the application of the above-described steps where PPE of high molecular weight (1) needs not be chain cleaved initially into small molecules. In another embodiment, either PPE of high molecular weight (2) or PPE of small molecular weight can mix and react with an epoxy resin (2), as shown in FIG. 2, and therefore, the reaction time can be reduced greatly.

Figure 3:
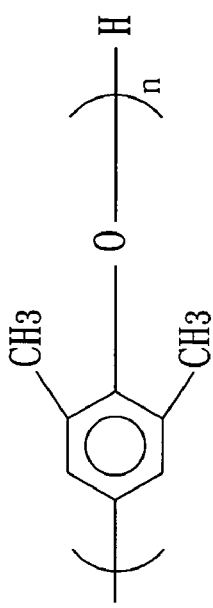
FIG. 3 shows the structure of PPE used in the embodiment of the invention.
Figure 4:
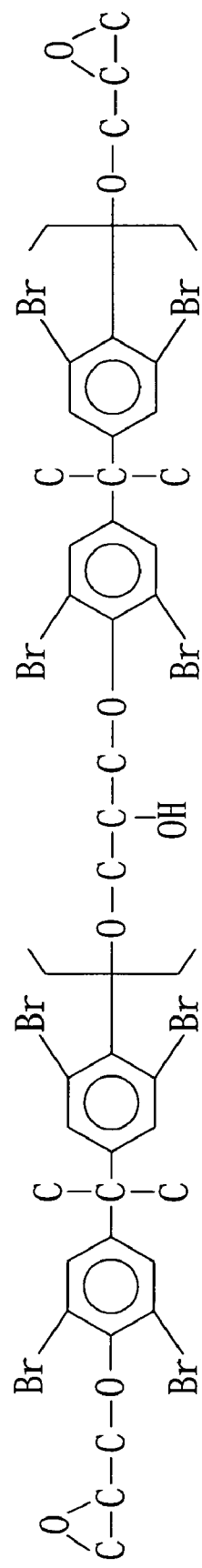
FIG. 4 shows the structure of the epoxy resin used in the embodiment of the invention.
Figure 5:
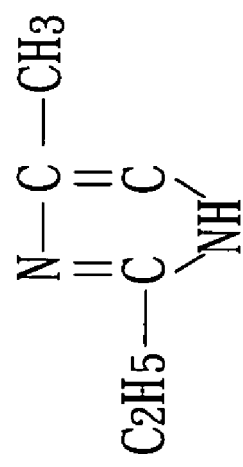
FIG. 5 shows the structure of 2-ethyl-4-methyl imidazole used in the embodiment of the invention.
Figure 6:
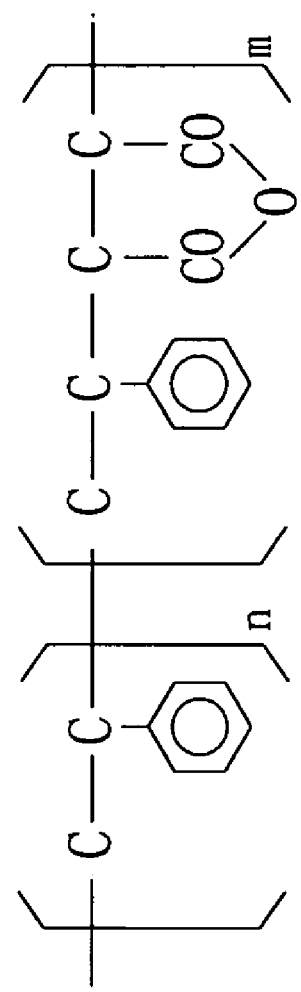
FIG. 6 shows the structure of styrene-maleic anhydride resin (SMA) used in the embodiment of the invention.
Figure 7:
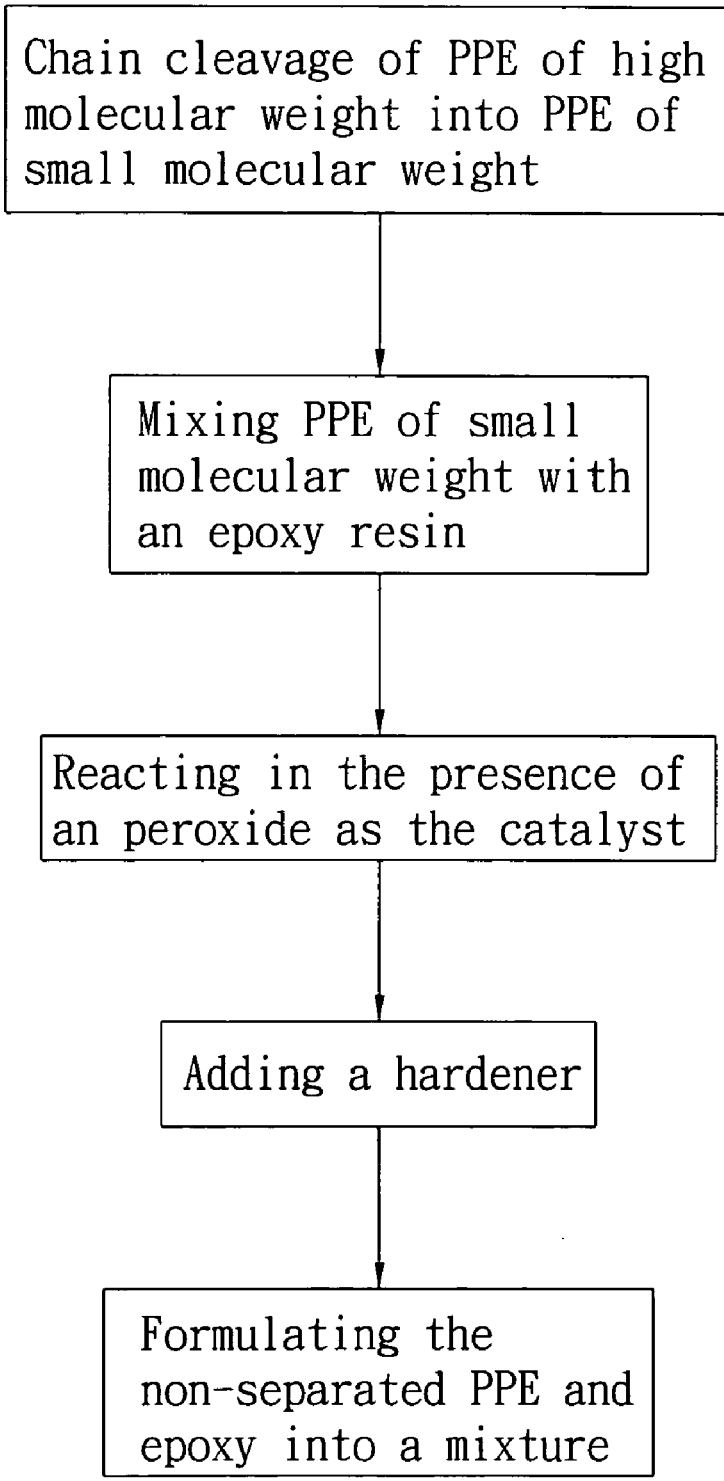
FIG. 7 is the flow chart illustrating a conventional process for producing high speed transmitting dielectric materials.
Figure 8:
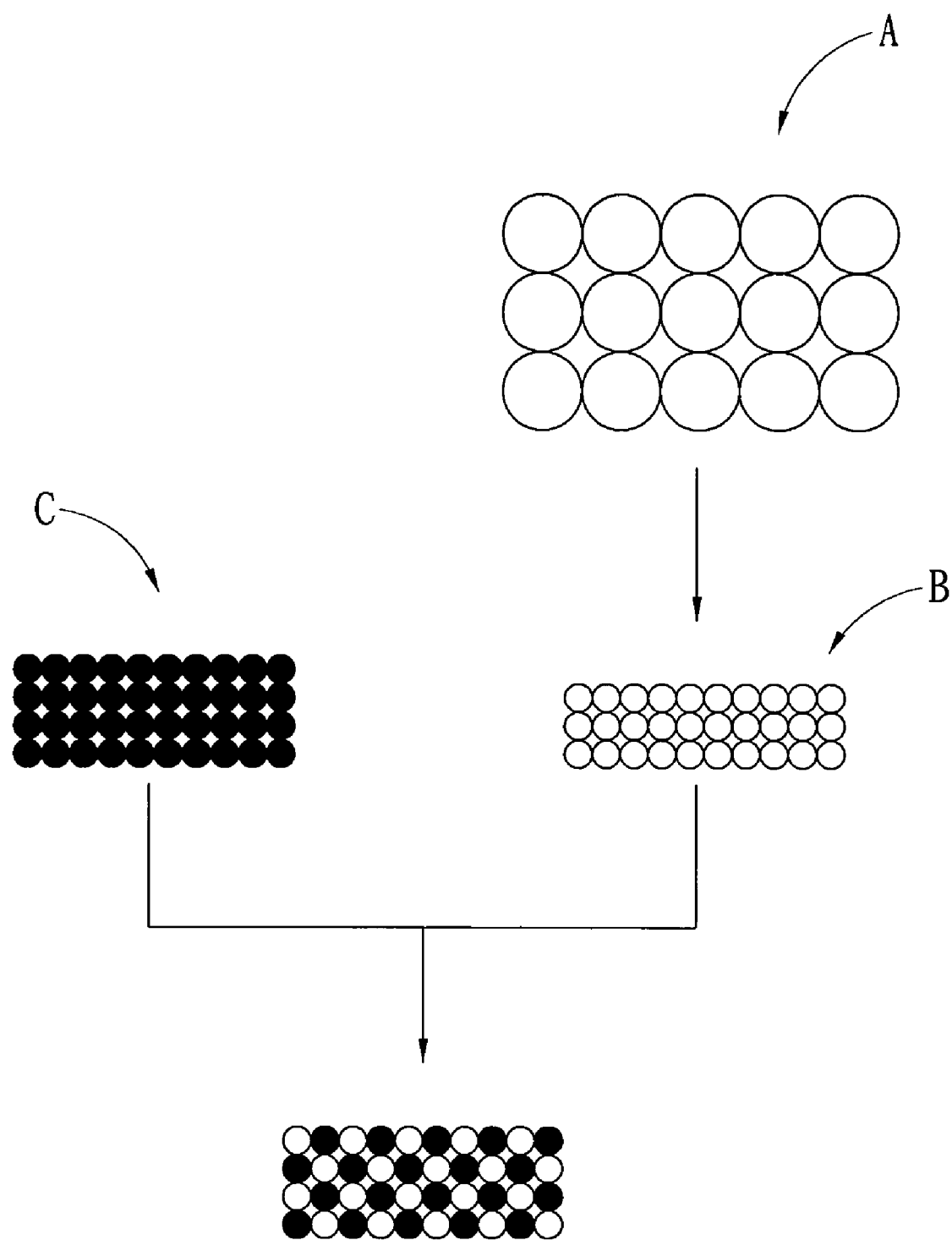
FIG. 8 is a schematic view showing the necessity of the chain cleavage of a conventional PPE into small molecular weight fragments to mix with an epoxy resin.

Based on experiments, components of formulations used in the invention may comprise:

1. Polyphenylene ether (PPE): in a proportion of 5%–95% by weight, and preferably, based on the comparison through experiments of the invention, of 20% by weight; the structure of PPE is shown in FIG. 3.
2. An epoxy resin of the type of low bromine content: in a proportion of 95%–5% by weight, and preferably of 80% by weight; its structure is shown in FIG. 4.
3. A catalyst: 2-ethyl-4-methyl imidazole, in a proportion of 0.2%–1% by weight, and preferably in a proportion of 0.5% by weight; its structure is shown in FIG. 5.
4. Non-polar solvent: toluene is used as the solvent in the invention to adjust the viscosity.
5. The hardener: may be one selected from the group consisting of styrene-maleic-anhydride resin (SMA), aliphatic amine and aromatic amine. Of these, SMA is used as the hardener in the invention; the structure of SMA is shown in FIG. 6.

According to the forgoing, the invention has the following advantages:

1. The process according to the invention comprises of reacting various proportions of PPE and an epoxy resin in a reactor at a temperature of 90° C. to 220° C. in the presence of a catalyst, wherein either PPE of high molecular weight or PPE of small molecular weight can react with the epoxy resin, in stead the chain cleavage of PPE into small molecules employed in the conventional technology, and therefore, the production time can be shorten greatly.
2. 2-ethyl-4-methyl imidazole used as the catalyst in the process of the invention has a high stability, and a low operation temperature such that the risk of the synthetic reaction is consequently lowered.
3. Since, as describe above, instead of the chain cleavage of PPE into small molecules employed by the conventional technology, the direct reaction of PPE of either high or low molecular weights in the process of invention can not only shorten greatly the production time, but also retain the original characteristics of the high frequency substrate or wireless communication substrate.

Accordingly, the process of the invention can achieve the expected purpose of the invention, and provide a process for producing high speed transmitting dielectric materials with industrial practicability.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claim is:

1. A process for producing high speed transmitting dielectric materials comprises steps of:
    a: mixing from 5%–95% by weight of polyphenylene ether (PPE) with from 95%–5% by weight of an epoxy resin possessing a low bromine content;
    b: reacting the mixture from step a in a non-polar solvent in the presence of 0.2%–1% by weight of a catalyst in a reactor at a temperature of 90° C.–220° C. the proportions based on the combined weight of the components;
    c: lowering the temperature in the reactor to 70° C., adding a hardener in the reactor and dissolving it therein; and
    d: formulating the PPE and said epoxy resin into a varnish before phase separation occurs.

2. The process for producing high speed transmitting dielectric materials as in claim 1, wherein in step a, the proportion of PPE is 20% by weight, and the proportion of said epoxy resin is 80% by weight.

3. The process for producing high speed transmitting dielectric materials as in claim 1, wherein in step b, the proportion of said catalyst is 0.5% by weight.

4. The process for producing high speed transmitting dielectric materials as in claim 1, wherein in step b, said catalyst is 2-ethyl-4-methyl imidazole.

5. The process for producing high speed transmitting dielectric materials as in claim 3, wherein in step b, said catalyst is 2-ethyl-4-methyl imidazole.

6. The process for producing high speed transmitting dielectric materials as in claim 1, wherein in step b, said non-polar solvent is toluene.

7. The process for producing high speed transmitting dielectric materials as in claim 1, comprising further following step of providing cooling by circulation in the step b to avoid the vaporization of said non-polar solvent.

8. The process for producing high speed transmitting dielectric materials as in claim 1, wherein in the step c, said hardener is one selected from the group consisting of styrene-maleic-anhydride (SMA), aliphatic amine and aromatic amine.

\* \* \* \* \*